(12) United States Patent
Na (10) Patent No.: US 6,242,940 B1
(45) Date of Patent: Jun. 5, 2001

(54) DATA INPUT BUFFER CIRCUIT

(75) Inventor: Joon-Ho Na, Cheongju (KR)

(73) Assignee: Hyundai Electronics Industries Co., Ltd., Seoul (KR)

( * ) Notice: Subject to any disclaimer, the term of this patent is extended or adjusted under 35 U.S.C. 154(b) by 0 days.

(21) Appl. No.: 09/453,478

(22) Filed: Dec. 2, 1999

(30) Foreign Application Priority Data

Apr. 7, 1999 (KR) .................................................. 99-12055

(51) Int. Cl.$^7$ .......................... H03K 19/0175; G11C 8/00
(52) U.S. Cl. ........................... 326/21; 326/82; 365/233.5; 365/189.05
(58) Field of Search .................... 326/21, 22, 23, 326/82, 83, 112, 113; 365/233.5, 233, 230.08, 189.05

(56) References Cited

U.S. PATENT DOCUMENTS

| | | | |
|---|---|---|---|
| 4,630,239 | * 12/1986 | Reed et al. | 365/233.5 |
| 4,658,253 | * 4/1987 | Johnson | 365/233.5 |
| 4,893,282 | * 1/1990 | Wada et al. | 365/233.5 |
| 5,633,833 | * 5/1997 | Yoon | 365/233.5 |
| 6,005,826 | * 12/1999 | Ahn et al. | 365/233.5 |

* cited by examiner

Primary Examiner—Michael Tokar
Assistant Examiner—Don Phu Le
(74) Attorney, Agent, or Firm—Fleshner & Kim, LLP (57) ABSTRACT

A data input buffer circuit is disclosed. This circuit includes a first basic circuit which includes a first NOR-gate for NORing a first control signal and a first data signal, a first inverter for inverting an output of the first NOR-gate, a first data maintaining unit for maintaining an enabled state of a first data control signal which is an output of the first inverter, and a first data transition detection unit for detecting a transition of the first data control signal and outputting a first data transition detection signal, second through n-th basic circuits constructed similarly with the first basic circuit for receiving second through n-th data signals and outputting second through n-th input data signals, a data transition detection signal summing unit for summing first through n-th data transition detection signals from the first through n-th data transition detection units, and a first delay unit for delaying an output of the data transition detection signal summing unit for a certain time and outputting a second control signal. Therefore, in the present invention, it is possible to decrease a current flow path due to a transition of an input data signal when a write enable signal WECS is disabled and prevent an invalid data from being written by obtaining an enough data hold time tDH without an increase of a delay device.

9 Claims, 8 Drawing Sheets

FIG. 10B    CS                                                High

FIG. 10E    WDSP

FIG. 11A DIN11

FIG. 11B WECS

FIG. 11C DINT11

FIG. 11D DTD11

FIG. 11E DTDSUM

FIG. 11F DTDSUMD

FIG. 11G WDSP

FIG. 11H DATAIN11

DATA INPUT BUFFER CIRCUIT

BACKGROUND OF THE INVENTION

1. Field of the Invention

The present invention relates to a data input buffer circuit, and in particular to a data input buffer circuit which is capable of decreasing a current consumption caused when a data signal is transited in a write disable interval by maintaining a state that a data signal is transited in a write enable interval in the write enable interval and accurately reading and writing data by obtaining a substantial data holding time(tDH) margin.

2. Description of the Background Art

Figure 1:
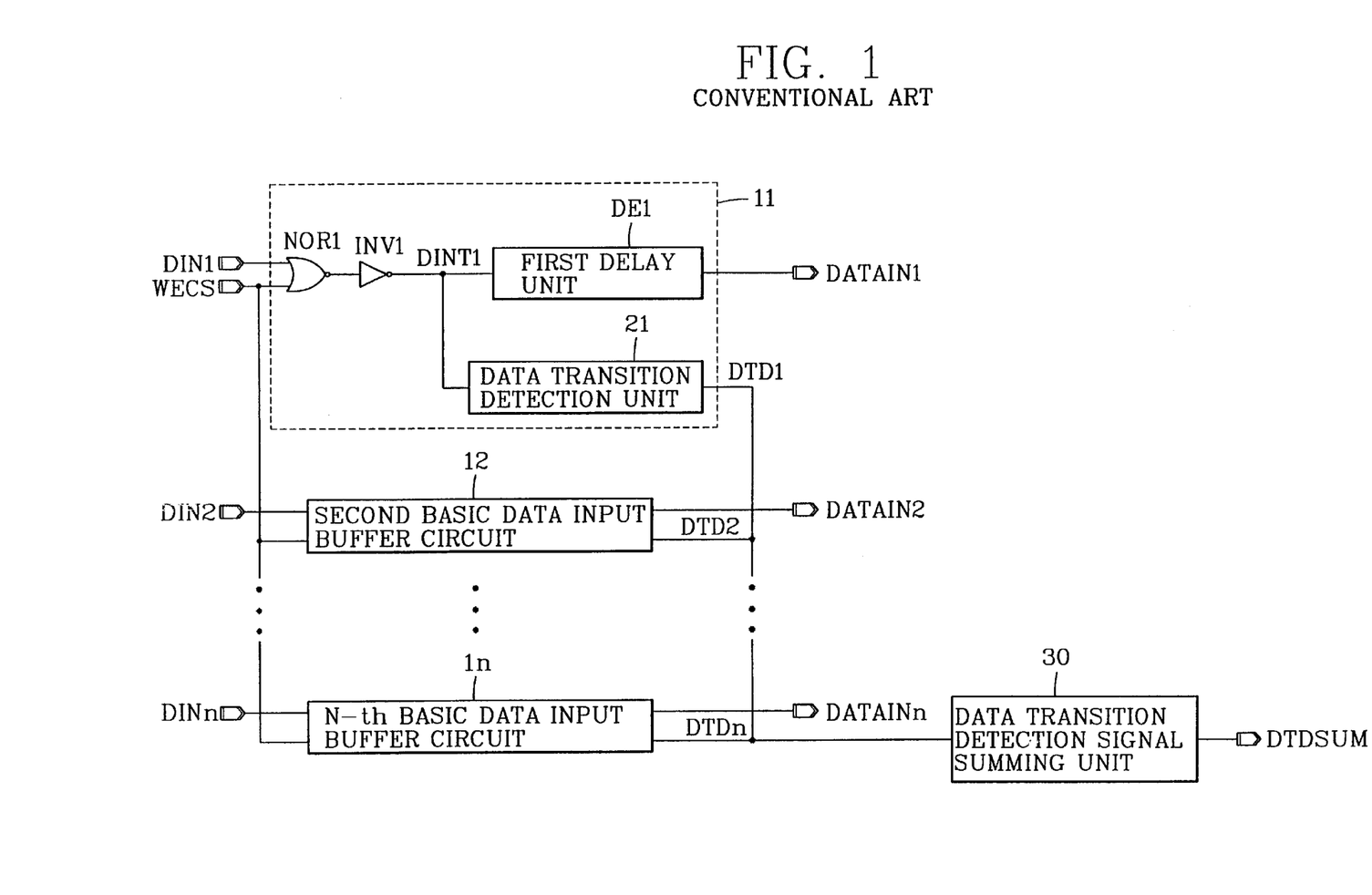
FIG. 1 is a block diagram illustrating a conventional data input buffer circuit.

FIG. 1 illustrates a conventional input buffer circuit which includes a first basic input data buffer circuit 11 which includes a first NOR-gate NOR1 for NORing a data control signal WECS formed by mixing a write enable signal WE and a chip selection signal CS and a first data signal DIN1 inputted into an external first data pad, a first inverter INV1 for inverting an output of the first NOR-gate NOR1, a first delay unit DE1 for delaying an output of the first inverter INV1 for a certain time Td1 and outputting a first input data signal DATAIN1, and a first data transition detection unit 20 for detecting a transition of the first data control signal DINT1 from the first inverter INV1 and outputting a first data transition detection signal DTD1. There are further provided data transition detection units 21~1n for receiving second~n-h data signals DIN2~DINn, and a data transition detection signal mixing unit 30 for mixing first~n-h data transition detection signals DTD1~DTDn outputted from the data transition detection units 2~2n of the first~n-h basic data input buffer circuits 11~1n which are configured in a similar method compared to the first basic input data buffer circuit 11.

The number of basic data input buffer circuits is determined depending on the number of input/output pins.

Figure 2:
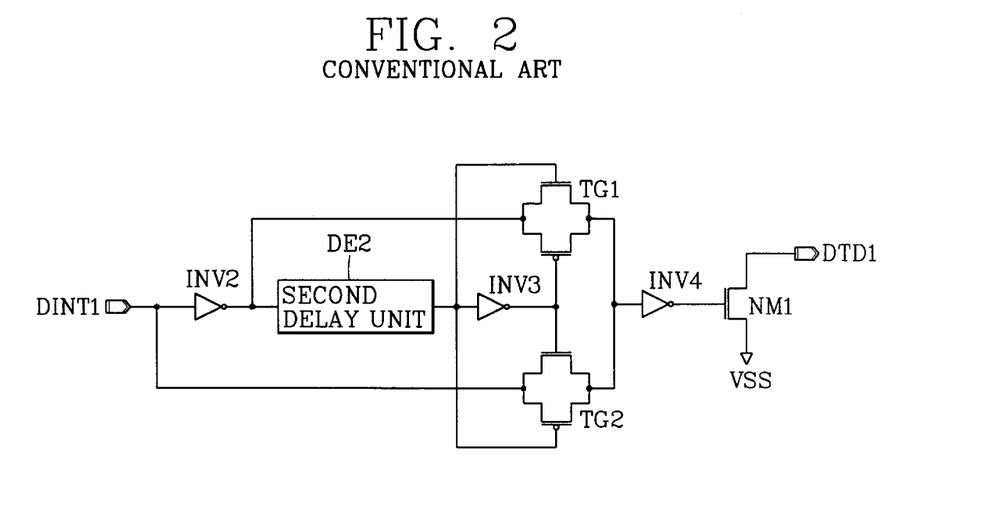
FIG. 2 is a circuit diagram illustrating a data transition detection unit of the block of FIG. 1.

FIG. 2 illustrates a first data transition detection unit 21. As shown therein, there are provided a second inverter INV2 for inverting a first data control signal DINT1 from the first inverter INV1, a second delay unit DE2 for delaying an output of the second inverter INV2 for a certain time, a third inverter INV3 for inverting an output of the second delay unit DE2, first and second transmission gates TG1 and TG2 controlled by an output of the second delay unit DE2 and an inverted signal thereof for selectively transmitting a first data control signal DINT2 from the first inverter INV1 and an inverted signal thereof, a fourth inverter INV4 for inverting an output from the first or second transmission gates TG1 or TG2, and a first NMOS transistor NM1 for receiving an output of the fourth inverter INV4 via its gate and outputting a first data transition detection signal DTD1 via its drain. In addition, the construction of a data transition detection unit(not shown) of the second through n-th basic data input buffer circuits 12~1n is constructed in the same manner as the first data transition detection unit 21.

Figure 3:
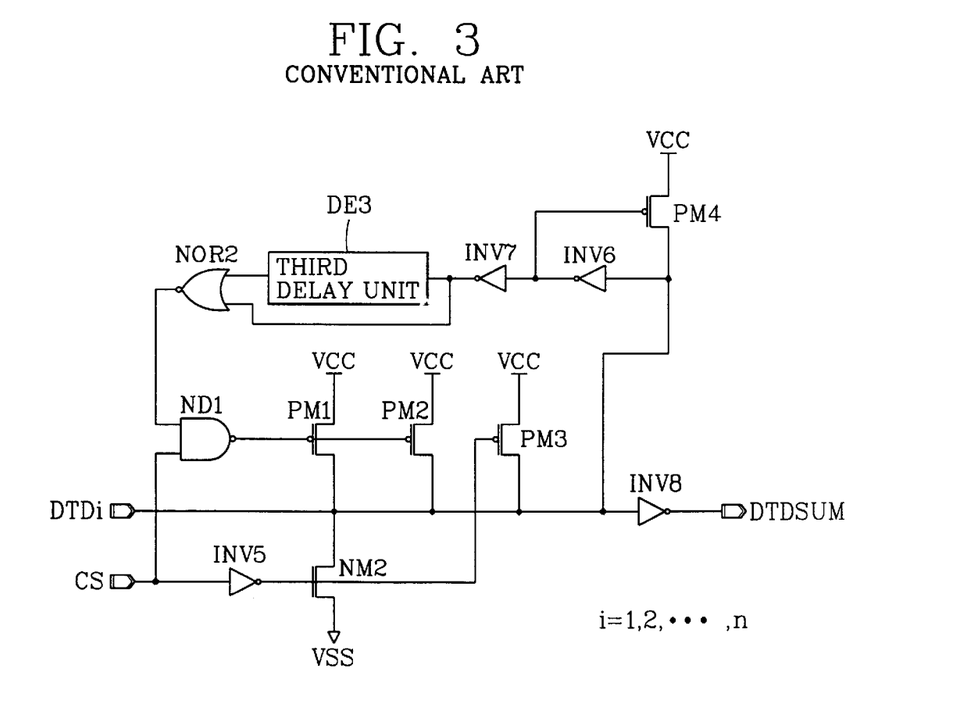
FIG. 3 is a detailed circuit diagram illustrating a data transition detection signal summing unit of FIG. 1.

FIG. 3 is a circuit diagram illustrating a detection signal summing unit 30 for summing the first through n-th data transition detection signals DTD1~DTDn. As shown therein, there are provided a first PMOS transistor PM1 and a second NMOS transistor NM2 connected in series between a power voltage VCC and a ground voltage VSS and having their commonly connected drains which receive first through n-th detection signals DTD1~DTDn, second through fourth PMOS transistors PM2~PM4 connected parallely with the first PMOS transistor PM1, a fifth inverter INV5 for inverting a chip selection signal CS and applying the inverted signal to the second NMOS transistor NM2 and the third PMOS transistor PM3, respectively, a sixth inverter INV6 for inverting the voltages of the commonly connected drains of the fourth PMOS transistor PM3 and the second NMOS transistor NM2 and applying to the gate of the fourth PMOS transistor PM4, a seventh inverter INV7 for inverting an output of the sixth inverter INV6, a third delay unit DE3 for delaying an output of the seventh inverter INV7 for a certain time, a second NOR-gate NOR2 for NORing an output of the third delay unit DE3 and an output of the seventh inverter INV7, a first NAND-gate ND1 for NANDing an output of the second NOR-gate NOR2 and a chip selection signal CS and outputting to the gates of the first and second PMOS transistors PM1 and PM2, respectively, and an eighth inverter INV8 for inverting a voltages of the commonly connected drains of the first through fourth PMOS transistors PM1~PM4 and the second NMOS transistor NM2 and outputting a summing signal DTDSUM of a data transition detection signal.

The operation of the conventional data input buffer circuit will be explained with reference to the accompanying drawings.

Figure 4A:
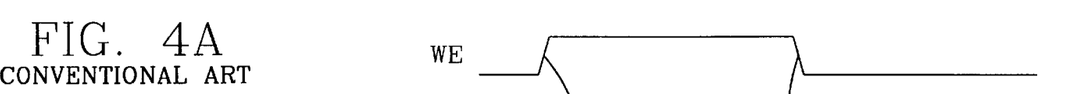
FIGS. 4A through 4H are timing diagrams of a conventional data input buffer circuit of FIG. 1.
Figure 4B:
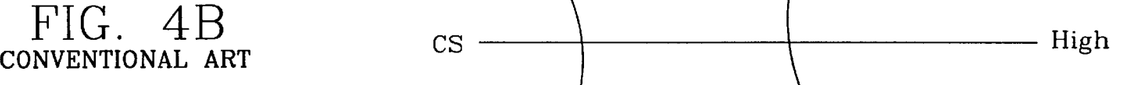
Figure 4C:
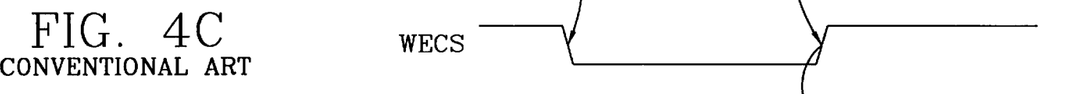
Figure 4D:
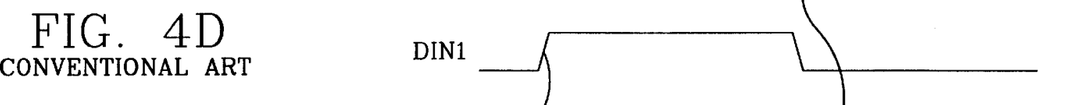
Figure 4E:
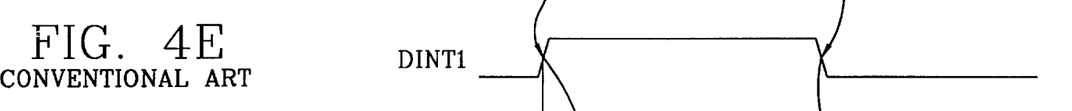

First, as shown in FIGS. 4A and 4B, the write enable signal WE and the chip selection signal CS are summed for thereby generating a write control signal WECS as shown in FIG. 4C. This write control signal WECS is summed with the first data signal DIN1 as shown in FIG. 4D inputted into an external first data pad, so that a first data control signal DINT1 as shown in FIG. 4E is generated.

Figure 4F:
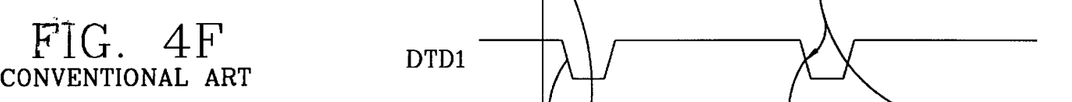
Figure 4G:
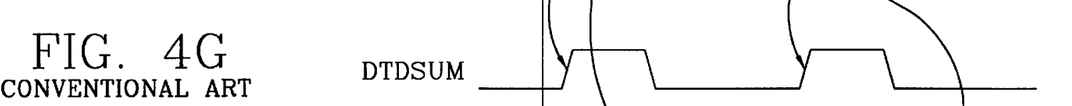
Figure 4H:
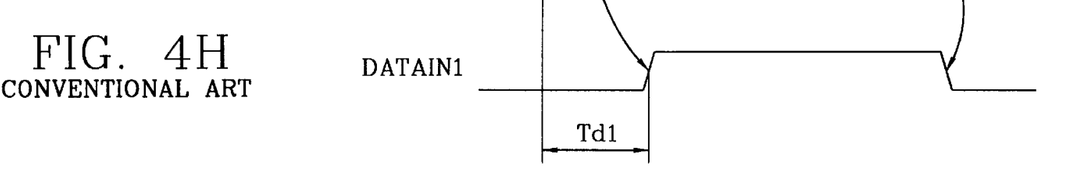

The first data control signal DINT1 is delayed by the first delay unit DE1 for a certain time and is outputted as a first input data signal DATAIN1 as shown in FIG. 4H.

The first data transition detection unit 21 generates a first data transition detection signal DTD1, as shown in FIG. 4F, for detecting the transition of the first data control signal DINT1.

When the second through n-th data transition detection signals DTD2~DTDn are outputted from the second n-th data transition detection units 22~2n, the data transition detection signal summing unit 30 sums the first through n-th data transition detection signals DTD1~DTDn for thereby generating a data transition detection signal summing signal DTDSUM.

The thusly generated data transition detection signal summing signal DTDSUM is used as a control signal when the semiconductor memory apparatus operates in the write mode.

However, the data control signal is disabled when the write control signal WECS is enabled and even disabled (transited from low to high), so that a current flow path is formed at an unnecessary interval for thereby increasing the current consumption. A data control signal is delated for obtaining a data hold time dDH margin using the first delay unit DE1. In this case, a certain variation may be produced due to various processes. Therefore, in order to obtain an enough data hold time tDH margin, a lot amount of inverters is used for a process margin of the first delay unit DE1 because an input data signal is transited at the write disable interval, and an invalid data may be written.

SUMMARY OF THE INVENTION

Accordingly, it is an object of the present invention to provide a data input buffer circuit which is capable of decreasing a current flow path due to a transition of an input data signal when a write enable signal WECS is disabled and preventing an invalid data from being written by obtaining an enough data hold time tDH without an increase of a delay device.

To achieve the above objects, there is provided a data input buffer circuit which includes a first basic circuit which includes a first NOR-gate for NORing a first control signal and a first data signal, a first inverter for inverting an output of the first NOR-gate, a first data maintaining unit for maintaining an enabled state of a first data control signal which is an output of the first inverter, and a first data transition detection unit for detecting a transition of the first data control signal and outputting a first data transition detection signal, second through n-th basic circuits constructed similarly with the first basic circuit for receiving second through n-th data signals and outputting second through n-th input data signals, a data transition detection signal summing unit for summing first through n-th data transition detection signals from the first through n-th data transition detection units, and a first delay unit for delaying an output of the data transition detection signal summing unit for a certain time and outputting a second control signal.

There is further provided a first delay unit for outputting a second control signal when an output of a data transition detection signal summing unit is delayed for a certain time.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The embodiments of the present invention will be explained with reference to the accompanying drawings.

Figure 5:
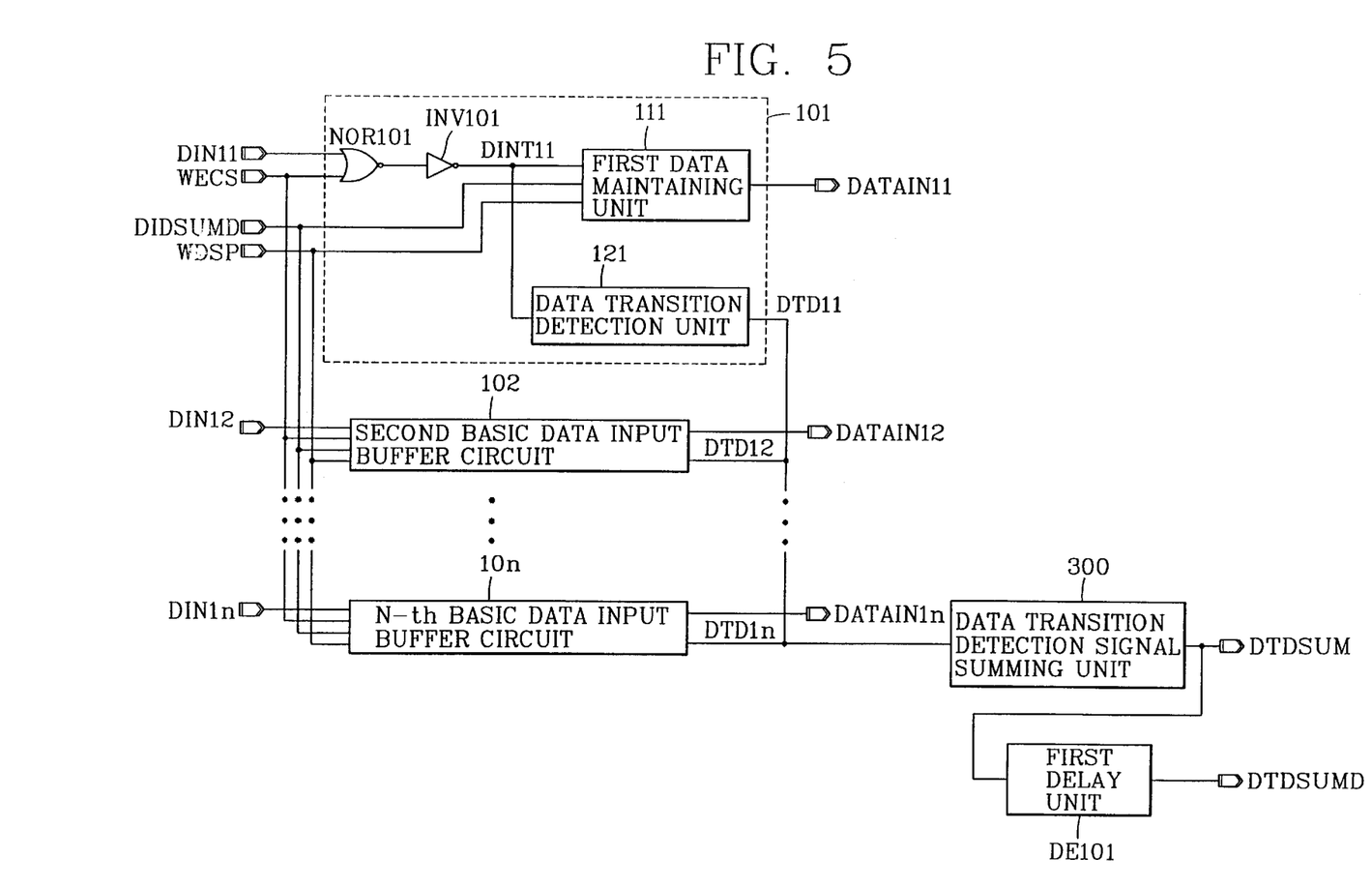
FIG. 5 is a block diagram illustrating a data input buffer circuit according to the present invention.

FIG. 5 illustrates the data input buffer circuit according to the present invention. As shown therein, the data input buffer circuit according to the present invention includes a first basic data input buffer circuit 101 which includes a first NOR-gate NOR101 for NORing a write enable signal WE, a write control signal WECS summed with a chip selection signal CS, and a first data signal DIN11 inputted into an external first data pad, a first inverter INV101 for inverting an output of the first NOR-gate NOR101, and a first data maintaining unit 110 in which a first data control signal DINT11 which is an output of the first inverter INV101 maintains a transited state in an enable interval of the write control signal WECS and is outputted as a first input data signal DATAIN11. There are further provided second through n-th basic data input buffer circuit 102 through 10n which are formed in the same construction as the first data input buffer circuit 101 for receiving second through n-th data signals DIN12 through DIN1n and outputting second through n-th data control signals DINT12 through DINT1n, a detection signal summing unit 300 for summing first through n-th data transition detection signals DTD11 through DTD1n which are the outputs of the first through n-th data transition detection units 120 of the first through n-th basic data input buffer circuits 101 through 10n, and a first delay unit for delaying an output of the data transition detection signal summing unit 300 and outputting a first transmission control signal DTDSUMD.

Here, the number of the basic data input buffer circuits is determined in accordance with the number of the input/output pins of the chip.

Figure 6:
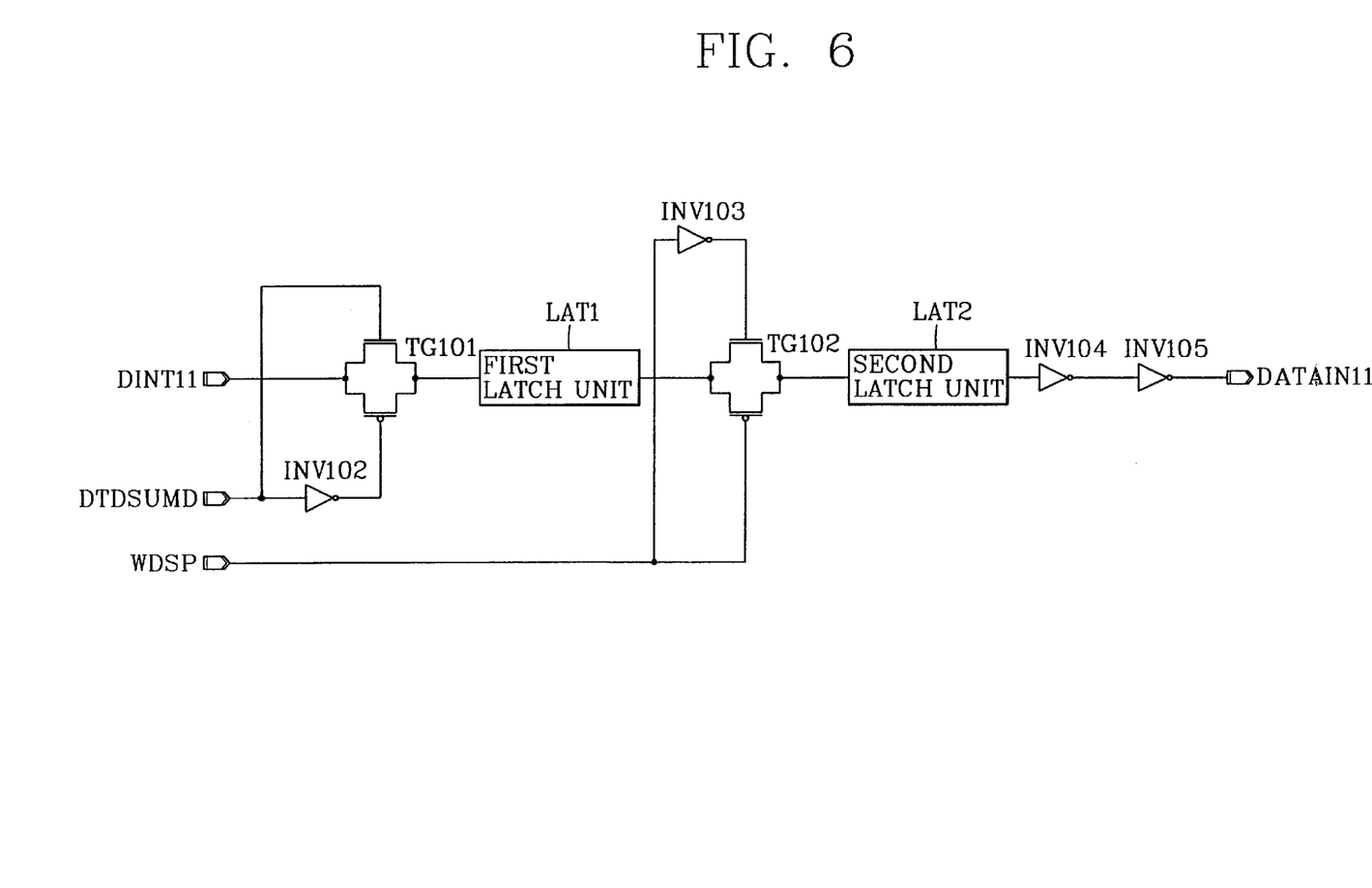
FIG. 6 is a detailed circuit diagram illustrating a data maintaining unit of FIG. 5.

FIG. 6 is a circuit diagram illustrating the first data maintaining unit 101. As shown therein, the first data maintaining unit 101 includes a first transmission gate TG101 controlled by a first transmission control signal DTDSUMD that an output DTDSUM of the data transition signal summing unit 300 is delayed by the first delay unit DE101 and a signal inverted by the second inverter INV102 for selectively outputting a first data control signal DINT11, a first latch unit LAT1 for latching a signal transmitted form the first transmission gate WDSP, a second transmission gate TG102 controlled by a second transmission control signal and a signal inverted by the third inverter INV103 for selectively transmitting a signal latched by the first latch unit LAT1, a second latch unit LAT2 for latching a signal transmitted by the second transmission gate TG102, and fourth and fifth inverters INV104 and INV105 for sequentially inverting the signals latched by the second latch unit LAT2 and outputting a first input data signal DATAIN11.

The construction of the second through n-th data maintaining units 112 through 11n are the same as the construction of the first data maintaining unit 111 so that the second through n-th data control signals DINT12 through DINT1n are inputted, and the second through n-th input data signals DATAIN12 through DATAIN1n are outputted.

Figure 7:
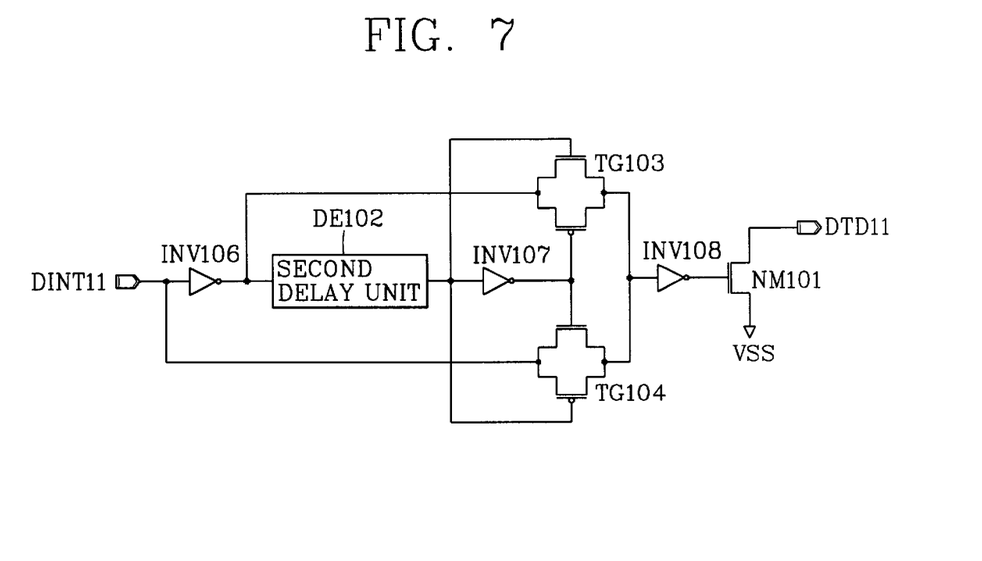
FIG. 7 is a detailed circuit diagram illustrating a data transition detection unit of FIG. 5.

FIG. 7 is a circuit diagram illustrating a firs data transition detection unit 120 for detecting a transition of the first data control signal DINT11 and outputting a first data transition detection signal DTD11. As shown therein, the first data transition detection unit 120 includes a sixth inverter INV106 for inverting a first data control signal DINT11, a second delay unit DE102 for delaying an output of the sixth inverter INV106 for a certain time, a seventh inverter INV107 for inverting an output of the second delay unit DE102, third and fourth transmission gates TG103 and TG104 controlled by an output of the second delay unit DE102 and an inverted signal of the output of the second delay unit DE102 for selectively outputting the first data control signal DINT11 and the inverted signal of the first data control signal DINT11, an eighth inverter INV108 for inverting the output of the third transmission gate TG103 or the fourth transmission gate TG104, and a first NMOS transistor NM101 having its gate receiving an output of the eighth inverter INV108, its source connected with a ground voltage VSS, and its drain outputting a first data transition detection signal DTD11.

The constructions of the second through n-th data transition detection units 122 through 12n are the same as the construction of the first data transition detection unit 12 so that the transitions of the second through n-th data control signals DINT12 through DINT1n are detected, and the second through n-th transition detection signals DTD12 through DTD1n are outputted.

Figure 8:
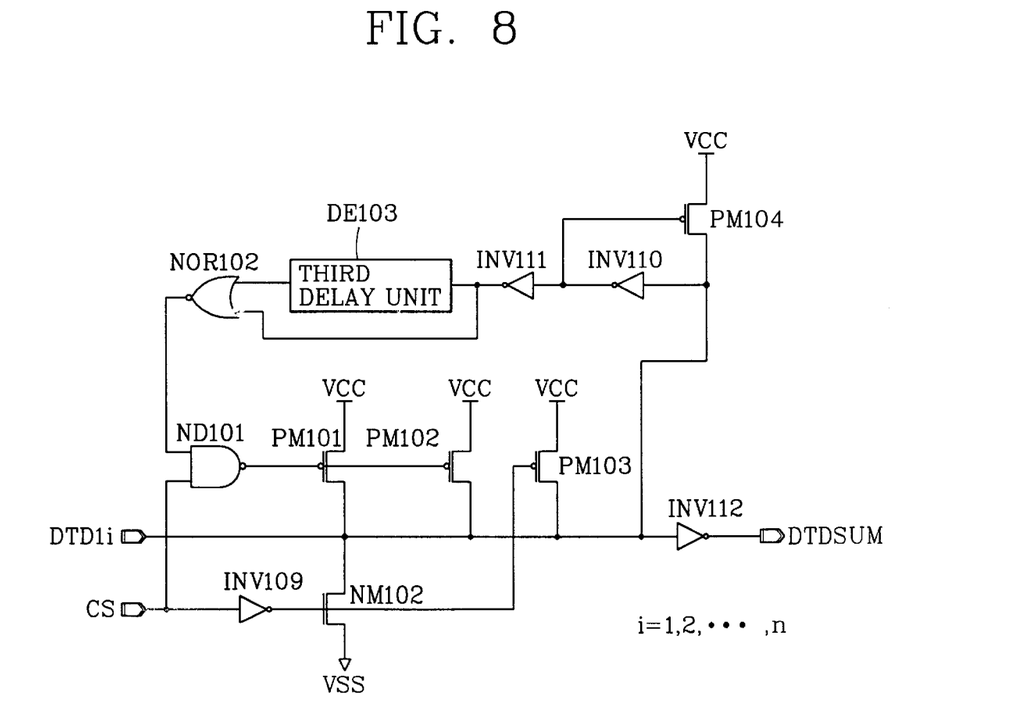
FIG. 8 is a detailed circuit diagram illustrating a data transition detection signal summing unit of FIG. 5.

FIG. 8 is a circuit diagram illustrating the data transition detection signal summing unit 300 for summing the first through n-th data transition detection signals DTD11 through DTD1n from the first through n-th data transition detection units 111 through 11n of the first through n-th basic data input buffer circuits 101 through 10n. As shown therein, the data transition detection signal summing unit 300 includes a first PMOS transistor PM101 and a second NMOS transistor NM102 connected in series between a power voltage VCC and a ground voltage VSS and having the commonly connected drains which receive the first through n-th data transition detection signals DTD11 through DTD1n, second through fourth PMOS transistors PM102 through PM104 parallely connected with the first PMOS transistor PM101, a ninth inverter INV109 for inverting the chip selection signal CS and outputting to the second NMOS transistor NM102 and the third PMOS transistor PM103, respectively, a tenth inverter INV110 for inverting the voltages of the commonly connected drain of the first through fourth PMOS transistors PM101 through PM104 and the second NMOS transistor NM102 and outputting to the gate of the fourth PMOS transistor PM104, an eleventh inverter INV111 for inverting an output of the tenth inverter INV110, a third delay unit DE103 for delaying an output of the eleventh inverter INV111 for a certain time, a second NOR-gate NOR102 for NORing the output of the third delay unit DE103 and the output of the eleventh inverter INV111, a first NAND-gate ND101 for NANDing the output of the second NOR-gate NOR102 and the chip selection signal CS and outputting to the gates of the first and second PMOS transistors PM101 and PM102, and a twelfth inverter INV112 for inverting the voltages of the commonly connected drains of the first through fourth PMOS transistors PM101 through PM104 and outputting a summed signal DTDSUM of the data transition detection signal.

Figure 9:
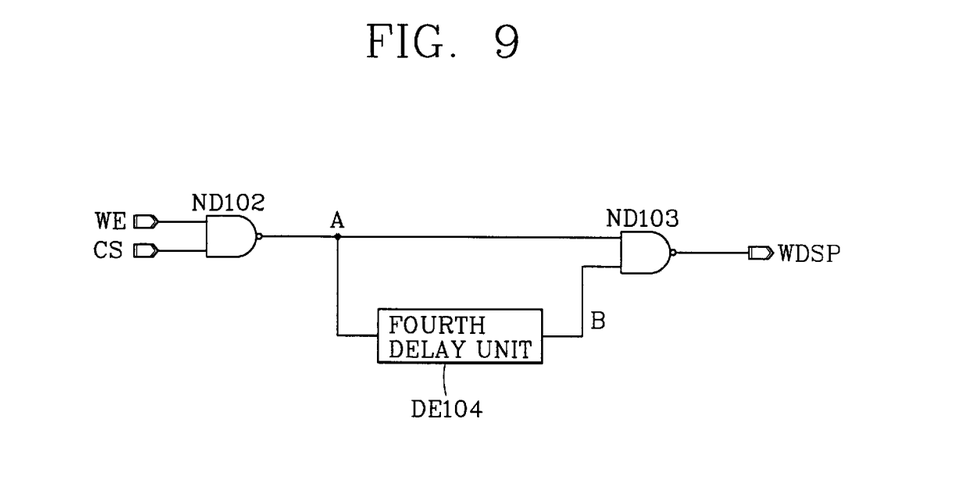
FIG. 9 is a detailed circuit diagram illustrating a second transmission control signal generation unit of FIG. 5.

FIG. 9 is a circuit diagram illustrating the second transmission control signal generation unit 400 which generates a second transmission control signal WDSP. As shown therein, the second transmission control signal generation unit 400 includes a second NAND-gate ND102 or NANDing the write enable signal WE and the chip selection signal CS, and a third NAND-gate ND103 for NANDing the output of the second NAND-gate ND102 and the output of the fourth delay unit DE104 and outputting a second transmission control signal WDSP.

The operation of the data input buffer circuit according to the present invention will be explained with reference to the accompanying drawings.

Figure 11A:
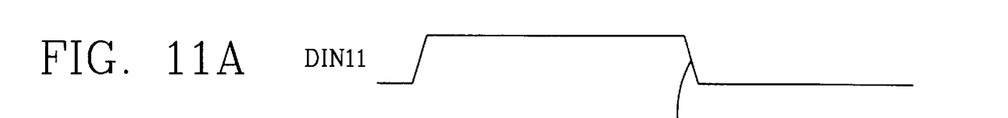
FIGS. 11A through 11H are timing views illustrating a data input buffer circuit of FIG. 5.
Figure 11B:
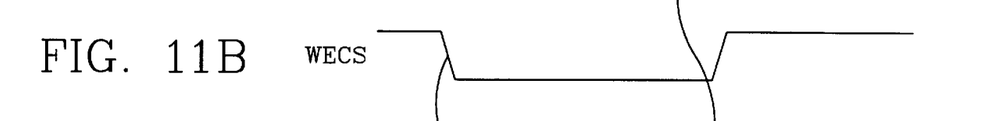
Figure 11C:
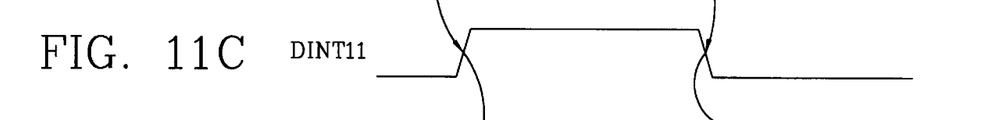

First, when a first data signal DIN1 as shown in FIG. 11B is inputted into the external first data input pad, the write control signal WECS and the first data signal DIN11 as shown in FIG. 11A are summed by the first NOR-gate NOR101 and are inverted by the first inverter INV101, so that the first data control signal DINT11 as shown in FIG. 11C is generated.

Figure 11D:
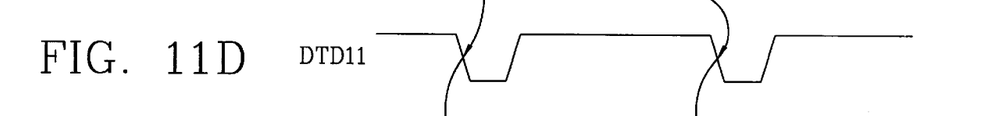

The transition of the first data control signal DINT11 is detected by the first data transition detection unit 121, and a first data transition detection signal DTD11 as shown in FIG. 11D is outputted. The transitions of the second through n-th data control signals DINT12 through DINT1n are detected by the second through n-th data transition units 122 through 12n, and the second through n-th data transition detection signals DTD12 through DTD1n are outputted.

Figure 11E:
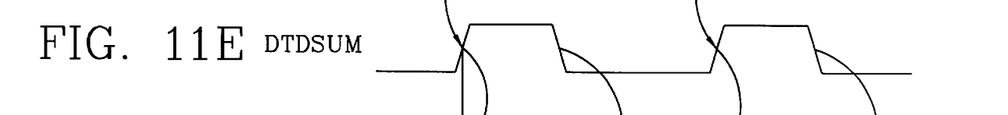

Continuously, the first through n-th data transition detection signals DTD11 through DTD1n are summed by the data transition detection signal summing unit 300, and a summed signal DTDSUM of the data transition detection signal as shown in FIG. 11E is outputted.

Figure 11F:
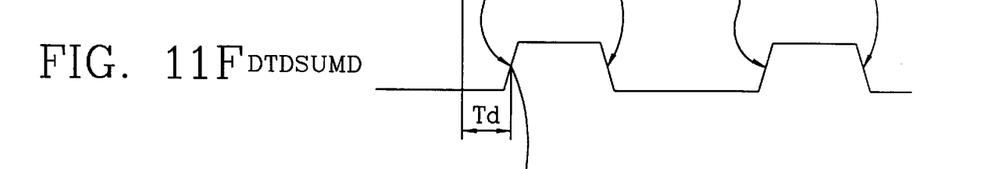

At this time, the summed signal DTDSUM of the data transition detection signal is delayed by the first delay unit DE101 for a certain time Td, and a first transmission control signal DTDSUMD as shown in FIG. 11F is outputted for controlling the first transmission gate TG101 of the first data maintaining unit 111.

Therefore, the first transmission gate TG101 of the first data maintaining unit 111 is turned on at the rising edge of the first transmission control signal DTDSUMD, and the first data control signal DINT11 is transmitted, so that the first data control signal DINT11 is latched by the first latch unit LAT1.

Figure 11G:
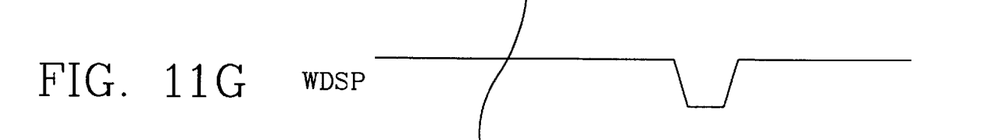
Figure 11H:
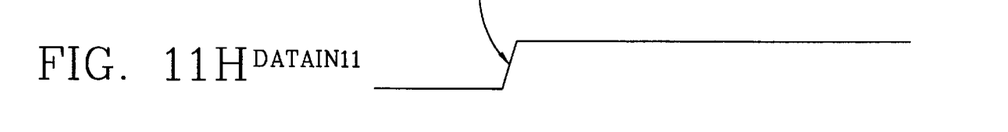

The second transmission gate TG102 of the first data maintaining unit 111 is turned on at the down edge of the second transmission control signal WDSP as shown in FIG. 11G generated by the latch control signal generation unit 300, and the first data control signal DINT11 latched by the first latch unit LAT1 is transmitted. Even when the write enable signal WE is transited to a low level by the second latch unit LAT2, namely, even when the write of the signal is disabled, the first data control signal DINT11 is not transited for thereby latching a previous state and maintaining the same.

Figure 10A:
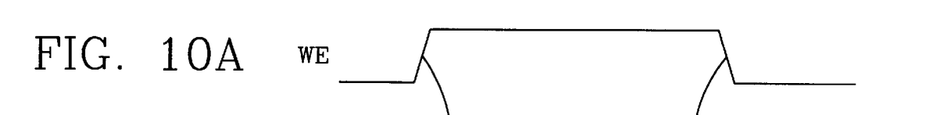
FIGS. 10A through 10E are timing view of a second transmission control signal generation unit of FIG. 9.
Figure 10B:
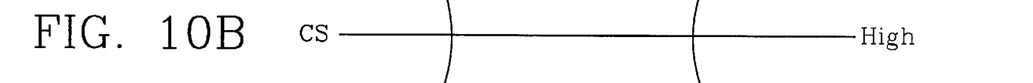
Figure 10C:
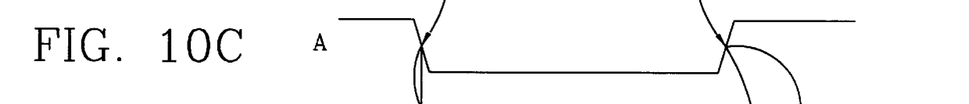
Figure 10D:
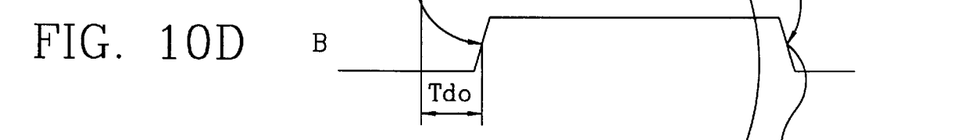
Figure 10E:
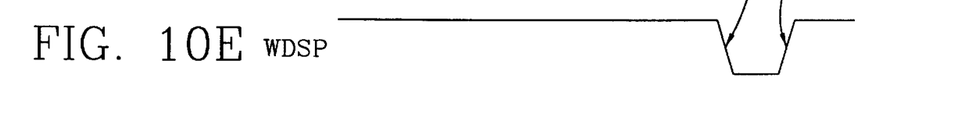

Here, as the write enable signal WE as shown in FIG. 10A and the chip selection signal CS as shown in FIG. 10B are NANDed by the first NAND-gate ND101, the second transmission control signal WDSP is outputted as a signal A as shown in FIG. 10C. The signal A and the signal B, as shown in FIG. 10D, that the signal A is delayed by the second delay unit DE102 for a certain time Tdo are NANDed, so that a signal is shorter by the delay time Tdo of the second delay unit DE102 and has a certain pulse width.

Continuously, the signals latched by the second latch unit LAT2 are stabilized by the fourth and fifth inverters INV104 and INV105 and are outputted as a first input data sinal DATAIN11.

Therefore, when the first input data signal DATAIN11 is write-enabled, the signal is continuously maintained in a state that the signal is not transited when the transited state does not become the write disabled state, so that it is possible to obtain an enough data hold time tDH.

Since the input data signal is not transited when the write control signal WECS is disabled, it is possible to decrease the current consumption due to a current path in an unnecessary path. In addition, since the data signal inputted in the write enable interval is latched in the write disable interval, it is possible to obtain an enough margin of the data hold time tDH, so that it is possible to prevent an ineffective data from being written for thereby implementing a stable write operation.

Although the preferred embodiment of the present invention have been disclosed for illustrative purposes, those skilled in the art will appreciate that various modifications, additions and substitutions are possible, without departing from the scope and spirit of the invention as recited in the accompanying claims.

What is claimed is:

1. A data input buffer circuit, comprising:

a first basic circuit which includes a first NOR-gate for NORing a first control signal and a first data signal, a first inverter for inverting an output of the first NOR-gate, a first data maintaining unit for maintaining an enabled state of a first data control signal which is an output of the first inverter, and a first data transition detection unit for detecting a transition of the first data control signal and outputting a first data transition detection signal;

second through n-th basic circuits constructed similarly with the first basic circuit for receiving second through n-th data signals and outputting second through n-th input data signals;

a data transition detection signal summing unit for summing first through n-th data transition detection signals from the first through n-th data transition detection units; and a first delay unit for delaying an output of the data transition detection signal summing unit for a certain time and outputting a second control signal.

2. The circuit of claim 1, wherein said first control signals is obtained by summing a write enable signal and a chip selection signal.

3. The circuit of claim 1, wherein said data maintaining unit includes:

a first transmission gate controlled by a second control signal and an inverted signal of the second control signal for selectively outputting a data control signal;

a first latch unit for latching a signal from the first transmission gate;

a second transmission gate controlled by a third control signal and an inverted sinal of the third control signal for selectively transmitting a signal latched by the first latch unit;

a second latch unit for latching a signal from the second transmission gate; and second and third inverters for sequentially inverting the signals latched by the second latch unit and outputting an input data signal.

4. The circuit of claim 3, wherein said third control signal has a short pulse signal generated by the control signal generation unit.

5. The circuit of claim 4, wherein said control signal generation unit includes:

a first NAND-gate for NANDing a write enable signal and a chip selection signal;

a second delay unit for delaying an output of the first NAND-gate; and a second NAND-gate for NANDing an output of the first NAND-gate and an output of the second delay unit.

6. The circuit of claim 3, wherein said third control signal is a short pulse signal having a pulse width determined based on a delay rate of the second delay unit.

7. The circuit of claim 1, wherein said data transition unit includes:

a fourth inverter for inverting a data control signal;

a third delay unit for delaying an output of the fourth inverter for a certain time;

a fifth inverter for inverting an output of the third delay unit;

third and fourth transmission gates controlled by an output of the third delay unit and an inverted signal of the output of the third delay unit for selectively outputting a data control signal and an inverted signal of the same;

a sixth inverter for inverting an output from the third transmission gate or the fourth transmission gate; and a first NMOS transistor having a source connected with a ground voltage, a gate receiving an output of the sixth inverter and a drain from which a data transmission detection signal is outputted.

8. The circuit of claim 1, wherein the number of basic circuits is determined by the number of input/output pins of a chip.

9. The circuit of claim 1, wherein said data transition detection signal summing unit includes:

a first PMOS transistor and a second NMOS transistor connected in series between a power voltage and a ground voltage and having commonly connected drains for receiving a plurality of data transmission detection signals therethrough;

second through fourth PMOS transistors connected parallely with the first PMOS transistor;

a seventh inverter for inverting a chip selection signal and applying the inverted signal to the gates of the second PMOS transistor and the third PMOS transistor;

an eighth inverter for inverting a voltage of the commonly connected drains of the first through fourth PMOS transistors and the first NMOS transistor and applying the inverted signal to the gate of the fourth PMOS transistor;

a ninth inverter for inverting an output of the eighth inverter;

a fourth delay unit for delaying an output of the seventh inverter for a certain time;

a second NOR-gate for NORing an output of the fourth delay unit and an output of the seventh inverter;

a third NAND-gate for NANDing an output of the second NOR-gate and a chip selection signal and outputting to the gates of the first and second PMOS transistors, respectively, and a tenth inverter for inverting the voltages of the commonly connected drains of the first through fourth PMOS transistors and the second NMOS transistor and outputting a summed signal of the data transition detection signal.

* * * * *